United States Patent
Jin et al.

(10) Patent No.: US 7,948,019 B2
(45) Date of Patent: May 24, 2011

(54) NONVOLATILE MEMORY DEVICES AND METHODS OF OPERATING THE SAME

(75) Inventors: Young-gu Jin, Hwaseong-si (KR);
Ki-ha Hong, Seoul (KR); Yoon-dong Park, Yongin-si (KR); Jai-kwang Shin, Anyang-si (KR); Suk-pil Kim, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 420 days.

(21) Appl. No.: 12/071,451

(22) Filed: Feb. 21, 2008

(65) Prior Publication Data

US 2008/0304328 A1    Dec. 11, 2008

(30) Foreign Application Priority Data

Jun. 7, 2007    (KR) .................. 10-2007-0055713

(51) Int. Cl.
*H01L 29/788* (2006.01)
(52) U.S. Cl. ................. 257/315; 257/E21.681; 257/314
(58) Field of Classification Search ........... 257/E21.209, 257/314, 315, E21.681
See application file for complete search history.

(56) References Cited

U.S. PATENT DOCUMENTS

| | | | |
|---|---|---|---|
| 6,069,380 A * | 5/2000 | Chou et al. | 257/315 |
| 6,838,726 B1 * | 1/2005 | Forbes et al. | 257/321 |
| 2004/0173839 A1 * | 9/2004 | Casarotto et al. | 257/315 |
| 2006/0046388 A1 * | 3/2006 | Park et al. | 438/257 |
| 2006/0237770 A1 * | 10/2006 | Huang et al. | 257/315 |

* cited by examiner

*Primary Examiner* — Jerome Jackson, Jr.
*Assistant Examiner* — Paul A Budd
(74) *Attorney, Agent, or Firm* — Harness, Dickey & Pierce, PLC

(57) ABSTRACT

Example embodiments include nonvolatile memory devices that have good operation performance and may be made in a highly integrated structure, and methods of operating the same. Example embodiments of the nonvolatile memory devices include a substrate electrode, and a semiconductor channel layer on the substrate electrode, a floating gate electrode on the substrate electrode, wherein a portion of the floating gate electrode faces the semiconductor channel layer, a control gate electrode on the floating gate electrode, and wherein a distance between a portion of the floating gate electrode and the substrate electrode is smaller than a distance between the semiconductor channel layer and the substrate electrode wherein charge tunneling occurs.

22 Claims, 10 Drawing Sheets
(1 of 10 Drawing Sheet(s) Filed in Color)

NONVOLATILE MEMORY DEVICES AND METHODS OF OPERATING THE SAME

PRIORITY STATEMENT

This application claims priority under 35 U.S.C. §119 to Korean Patent Application No. 10-2007-0055713, filed on Jun. 7, 2007, in the Korean Intellectual Property Office, the entire contents of which are incorporated herein by reference.

BACKGROUND

1. Field

Example embodiments relate to semiconductor devices, and more particularly, to nonvolatile memory devices capable of storing data and methods of operating the same.

2. Description of the Conventional Art

Nonvolatile memory devices, e.g., electronically erasable programmable read only memories (EEPROMs) or flash memories may store data even when power is turned off, and further, stored data may be erased there from and new data may be programmed thereto. Nonvolatile memory devices may be used in semiconductor products, e.g., storage media for mobile devices or portable memory sticks, etc.

Recently, with the trend toward smaller semiconductor products, nonvolatile memory devices used in the semiconductor products have become highly integrated. For example, three-dimensional nonvolatile memory devices may have a higher degree of integration in a plane compared to planar-type nonvolatile memory devices and may be manufactured using silicon-on-insulator (SOI) substrates or nanowire structures. However, in three-dimensional nonvolatile memory devices, a semiconductor layer used as a channel is insulated from a substrate. Thus, like in conventional planar-type nonvolatile memory devices, it is difficult to perform an erasing operation when using a substrate. However, an erasing voltage may be directly applied to a semiconductor layer, but, a high voltage circuit may be additionally required and/or an operating speed may be reduced.

SUMMARY

Example embodiments provide nonvolatile memory devices that have good operating performance, may be made with a highly integrated structure, and methods of operating the nonvolatile memory devices.

According to example embodiments, a nonvolatile memory device may include a substrate electrode, a semiconductor channel layer on the substrate electrode, a floating gate electrode, and a control gate electrode. The floating gate electrode may have a portion facing towards the semiconductor channel layer. Example embodiments may also have a space between a portion of the floating gate electrode and the substrate electrode that may be smaller than a space between the semiconductor channel layer and the substrate electrode. Also, charge tunneling may occur between a portion of the floating gate electrode and the substrate electrode.

In example embodiments, the semiconductor channel layer may include semiconductor nanowires, which may be doped with P- or N-type impurities and have no PN junction. The semiconductor channel layer may also include a semiconductor thin film. The spacing between the portion of the floating gate electrode and the substrate may range from 5 to 50 nm and/or 10 to 30 nm.

According to example embodiments, the floating gate electrode may partially surround the semiconductor channel layer, and an end of the floating gate electrode may extend beyond the semiconductor channel layer and faces towards the substrate electrode. The end of the floating gate electrode may form a t-shape or tap that faces towards the substrate electrode.

According to example embodiments, the floating gate electrode may completely surround the semiconductor channel layer. According to example embodiments, the floating gate electrode may be have at least a first side adjacent to a side of the semiconductor channel layer and at a second side facing towards the substrate electrode. The control gate electrode may partially surround a portion of the floating gate electrode and extend in the direction of the substrate electrode. Also, an insulating layer may be between two adjacent layers, for example, the substrate electrode and the semiconductor channel layer, and/or the floating gate electrode and the control gate electrode. The floating gate electrode and the substrate electrode may both be conductive and the substrate may include a semiconductor wafer. The semiconductor wafer may include at least one protrusion extending in the direction of the floating gate electrode.

According to example embodiments, a method of operating a nonvolatile memory device is provided. In a programming operation, charges are injected from the semiconductor channel layer into the floating gate electrode. In an erasing operation, charges are removed from the floating gate electrode into the substrate electrode. According to example embodiments, in the programming operation, a substrate voltage may be applied to the substrate electrode, which may include the range from 0 to 5 V and a programming voltage higher than the substrate voltage, which may include the range of 7 to 20 V may be applied to the control gate electrode. According to example embodiments, in the erasing operation, an erasing voltage, which may include the range from 7 to 20 V may be applied to the substrate electrode, and the control gate electrode may be grounded and/or the semiconductor channel layer may also be grounded.

BRIEF DESCRIPTION OF THE DRAWINGS

The patent or application file contains at least one drawing executed in color. Copies of this patent or patent application publication with color drawing will be provided by the Office upon request and payment of the necessary fee.

Example embodiments will be more clearly understood from the following detailed description taken in conjunction with the accompanying drawings.

FIGS. 1 and 2 are sectional views illustrating a nonvolatile memory device according to example embodiments;

FIGS. 3 and 4 are sectional views illustrating a method of operating the nonvolatile memory device of FIGS. 1 and 2;

FIGS. 5 and 6 are sectional views illustrating a nonvolatile memory device according to example embodiments;

FIGS. 7 and 8 are sectional views illustrating a nonvolatile memory device according to example embodiments;

FIGS. 9 and 10 are sectional views illustrating a nonvolatile memory device according to example embodiments;

FIGS. 11 and 12 are sectional views illustrating a nonvolatile memory device according to example embodiments;

FIGS. 13 and 14 are sectional views illustrating a nonvolatile memory device according to example embodiments;

FIG. 15 is a perspective view illustrating a nonvolatile memory device according to example embodiments;

FIG. 16 is a partially cut-away perspective view of the nonvolatile memory device of FIG. 15;

FIG. 17 is an example simulation view illustrating a programming operation of the nonvolatile memory device of FIGS. 15 and 16;

FIG. 18 is a an example simulation view illustrating an erasing operation of the nonvolatile memory device of FIGS. 15 and 16;

FIG. 19 is a graph illustrating the leakage current characteristics of a nonvolatile memory device according to a conventional example; and FIG. 20 is a graph illustrating the leakage current characteristics of a nonvolatile memory device according to example embodiments.

DETAILED DESCRIPTION OF EXAMPLE EMBODIMENTS

Figure 1:
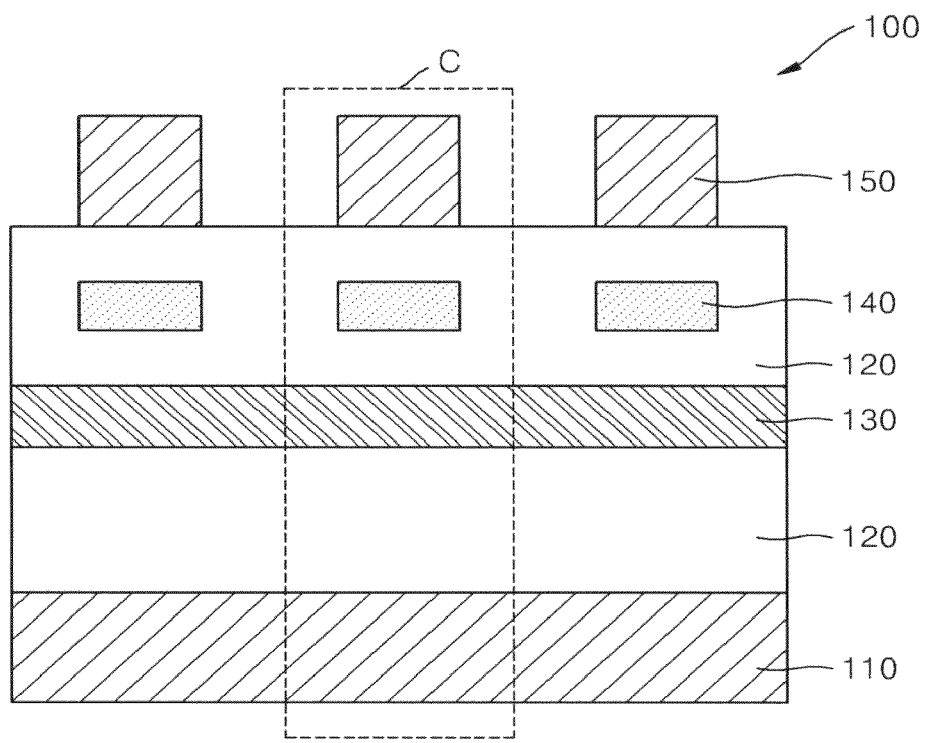
FIGS. 1-20 represent non-limiting, example embodiments as described herein.

Various example embodiments will now be described more fully with reference to the accompanying drawings in which some example embodiments are illustrated. In the drawings, the thicknesses of layers and regions may be exaggerated for clarity.

Detailed illustrative embodiments are disclosed herein. However, specific structural and functional details disclosed herein are merely representative for purposes of describing example embodiments. This invention may, however, may be embodied in many alternate forms and should not be construed as limited to only example embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the scope of example embodiments.

Spatially relative terms, e.g. "beneath," "below," "lower," "above," "upper" and the like, may be used herein for ease of description to describe one element or a relationship between a feature and another element or feature as illustrated in the figures. It will be understood that the spatially relative terms are intended to encompass different orientations of the device in use or operation in addition to the orientation depicted in the Figures. For example, if the device in the figures is turned over, elements described as "below" or "beneath" other elements or features would then be oriented "above" the other elements or features. Thus, for example, the term "below" can encompass both an orientation which is above as well as below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, e.g. those defined in commonly used dictionaries, should be interpreted as having a meaning that is consistent with their meaning in the context of the relevant art and will not be interpreted in an idealized or overly formal sense unless expressly so defined herein.

In order to more specifically describe example embodiments, various aspects will be described in detail with reference to the attached drawings. However, example embodiments are not limited to example embodiments described.

Example embodiments will now be described more fully with reference to the accompanying drawings, in which exemplary embodiments of the invention are shown. Example embodiments may, however, be embodied in many different forms and should not be construed as being limited to the embodiments set forth herein. Rather, these embodiments are provided so that this disclosure will be thorough and complete, and will fully convey the scope of the invention to one of ordinary skill in the art. In the drawings, the sizes of constitutional elements may be exaggerated for convenience of illustration.

Figure 2:
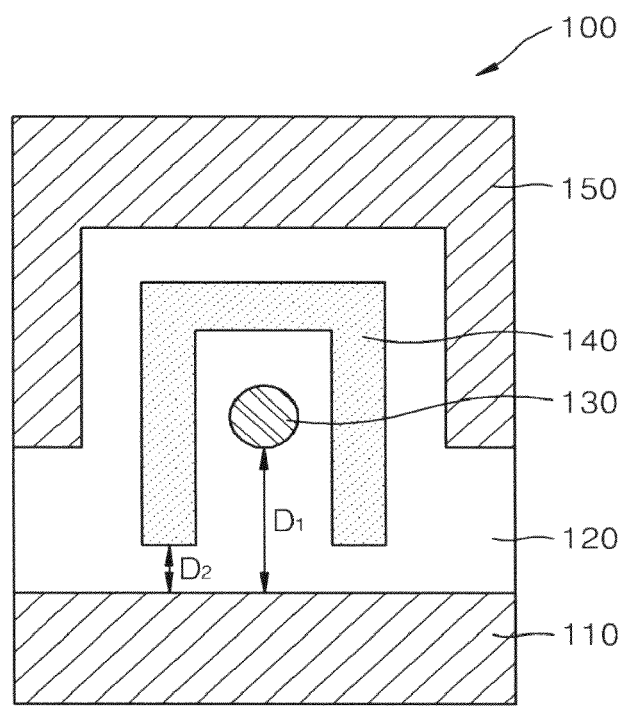

FIGS. 1 and 2 are sectional views illustrating a nonvolatile memory device 100 according to example embodiments. The nonvolatile memory device 100 may have a NAND structure. FIG. 1 illustrates a sectional view taken along a bit line direction, and FIG. 2 illustrates a sectional view taken along a word line direction.

Referring to FIGS. 1 and 2, unit cells C may be arranged in a bit line direction. The unit cells C may function as memory transistors. In such a NAND structure, the number of the unit cells C may be appropriately selected and are not intended to limit the scope of the example embodiments. Furthermore, it should be understood that the unit cells C may also be applied to other structure besides the NAND structure, e.g., a NOR structure or an AND structure. Hereinafter, the structure of the unit cells C will be described in more detail.

A semiconductor channel layer 130 may be on a substrate electrode 110. The substrate electrode 110 may be used in the operation of the nonvolatile memory device 100, as will be described later. For example, the substrate electrode 110 may be used in an erasing operation of the nonvolatile memory device 100. For example, the substrate electrode 110 may include a conductive material or a semiconductor material. The conductive material may include metal or metal silicide, and the semiconductor material may include a doped semiconductor wafer. The semiconductor channel layer 130 may provide a charge transfer path when a nonvolatile memory device 100 is turned on. In the NAND structure, the semiconductor channel layer 130 may be connected to bit lines and a common source line. In the nonvolatile memory device 100, the semiconductor channel layer 130 may include semiconductor nanowires. For example, the semiconductor nanowires may have a cylindrical shape and may extend along the bit line direction. The shape of the semiconductor nanowires is not limited to a cylindrical shape, and thus, the semiconductor nanowires may have other shapes e.g. a polyprismatic shape, rectangular, and square. Nanosized semiconductor materials may be designated as semiconductor nanowires. However, nanowires may also include fine-sized semiconductor materials, for example, Si, SiGe, GaAs, or ZnO. Semiconductor nanowires may have a thin body structure and may function as a channel of a memory transistor even when there is no PN junction by doping with one of P- and N-type impurities. As no PN junction exists in the semiconductor nanowires, the leakage current of a memory transistor may be reduced. As a result, retention characteristics of the voltage applied to the semiconductor nanowires may be improved, and/or the channel boosting efficiency of the memory transistor may be increased. Furthermore, the semiconductor nanowires may be easily stacked, and thus, a nonvolatile memory device 100 may be highly integrated using a stack structure.

A floating gate electrode 140 may be on the substrate electrode 110 and a portion of the floating gate electrode 140 may face towards the semiconductor channel layer 130. For example, the floating gate electrode 140 may partially surround the semiconductor channel layer 130, and portions (e.g., ends) of the floating gate electrode 140 may extend towards the semiconductor channel layer 130 so as to face the substrate electrode 110.

A space $D_2$ between the ends of the floating gate electrode 140 and the substrate electrode 110 may be smaller than a space D, between the semiconductor channel layer 130 and the substrate electrode 110. For example, the space $D_2$ may be appropriately adjusted so that charge tunneling may occur between the floating gate electrode 140 and the substrate electrode 110. The space $D_2$ may range from 5 to 50 nm. If the space $D_2$ is less than 5 nm, charge tunneling may occur too easily, thereby lowering charge retention characteristics. Conversely, if the space $D_2$ exceeds 50 nm, charge tunneling may be difficult. For example, when an operating voltage of the nonvolatile memory device 100 is 5 to 30V, improved charge retention and/or charge tunneling characteristics may be achieved at a space $D_2$ of 10 to 30 nm.

The floating gate electrode 140 may store charges and may include a conductive material enabling a charge transfer therein. For example, the floating gate electrode 140 may include polysilicon, metal, and/or metal silicide. Thus, charges stored in the floating gate electrode 140 may be injected into the substrate electrode 110 via the ends of the floating gate electrode 140.

A control gate electrode 150 may be on the floating gate electrode 140. For example, the control gate electrode 150 may extend toward the substrate electrode 110 in such a way as to partially surround a portion of the floating gate electrode 140 in order to increase a coupling ratio between the control gate electrode 150 and the floating gate electrode 140. Thus, the floating gate electrode 140 may be effectively controlled by the control gate electrode 150.

Furthermore, the control gate electrode 150 may partially surround a portion of the semiconductor channel layer 130. Thus, the control efficiency of the semiconductor channel layer 130, by the control gate electrode 150 may be higher than that of a conventional planar-type structure. For example, the control gate electrode 150 may include a conductive material, e.g., polysilicon, metal, and/or metal silicide.

An insulating layer 120 may be between two adjacent layers, for example, the substrate electrode 110 and the semiconductor channel layer 130 and/or the floating gate electrode 140 and the control gate electrode 150. The insulating layer 120 is intended to be broadly interpreted and may include at least one insulating material. For example, the insulating layer 120 between the semiconductor channel layer 130 and the floating gate electrode 140 may be termed "a tunneling insulating layer," whereas, the insulating layer 120 between the floating gate electrode 140 and the control gate electrode 150 may be termed "a blocking insulating layer." The tunneling insulating layer and the blocking insulating layer may be formed of the same or different materials. For example, the insulating layer 120 may include one of an oxide film, a nitride film, and a high-K dielectric film, or a staked structure thereof.

Figure 3:
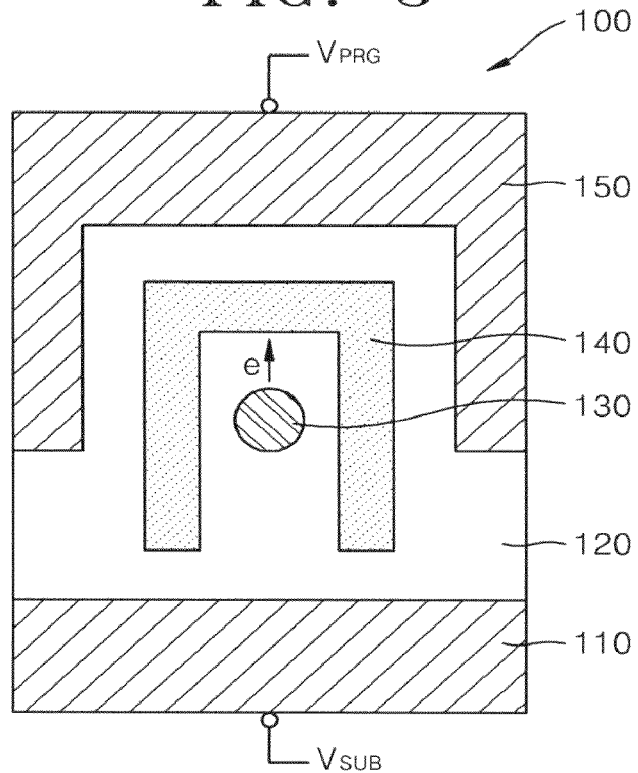
Figure 4:
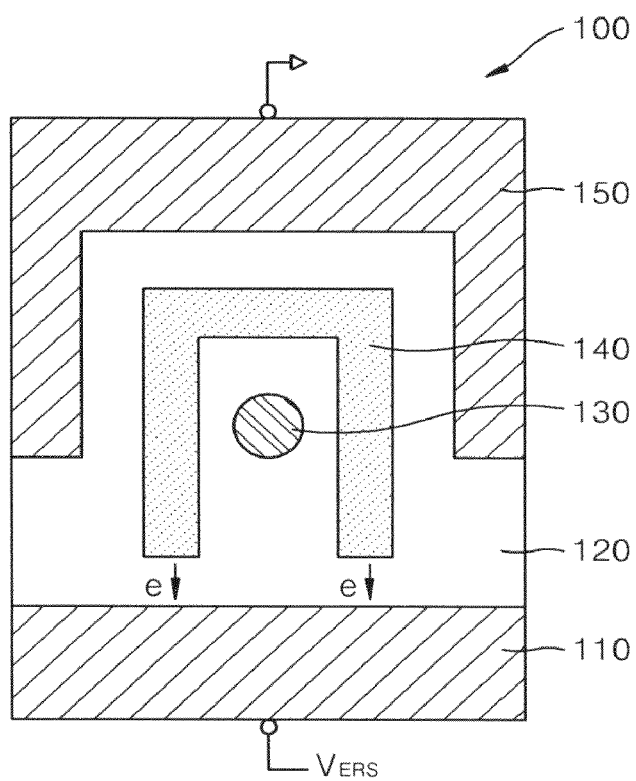

FIGS. 3 and 4 are sectional views illustrating a method of operating the nonvolatile memory device 100 of FIGS. 1 and 2. Referring to FIG. 3, a programming operation may be performed by injecting charges from the semiconductor channel layer 130 into the floating gate electrode 140. For example, a programming voltage $V_{PRG}$ may be applied to the control gate electrode 150, and a substrate voltage $V_{SUB}$ may be applied to the substrate electrode 110. The substrate voltage $V_{SUB}$ may range from about 0 to 5 V and the programming voltage $V_{PRG}$ may range from about 7 to 20 V, which may be higher than the substrate voltage $V_{SUB}$ and may result in a voltage of about 5 to 10 V being induced between the floating gate electrode 140 and the semiconductor channel layer 130.

During the programming operation, electrons e from the semiconductor channel layer 130 may be injected into the floating gate electrode 140 by tunneling. The floating gate electrode 140 may store the electrons e, thereby programming data bits. The amount of charges stored in the floating gate electrode 140 may be controlled in a multiplex mode, and thus, multi-bit data may be programmed in a single floating gate electrode.

The programming state of data bits may be read by determining whether or not the nonvolatile memory device 100 is turned on. During a reading operation, the semiconductor channel layer 130 would be "turned of F" by the electrons e stored in the floating gate electrode 140 and therefore, little to no current would flow in the nonvolatile memory device 100.

Referring to FIG. 4, an erasing operation may be performed by removing the charges stored in the floating gate electrode 140 into the substrate electrode 110. For example, an erasing voltage $V_{ERS}$ may be applied to the substrate electrode 110, and the control gate electrode 150 and/or the semiconductor channel layer 130 may be grounded. The erasing voltage $V_{ERS}$ may range from about 7 to 20 V. The floating gate electrode 140 between the control gate electrode 150 and the semiconductor channel layer 130 may be maintained at about 0 V. As such, when the erasing voltage $V_{ERS}$ is applied, the electrons e stored in the floating gate electrode 140 may tunnel into the substrate electrode 110 via the ends of the floating gate electrode 140. Therefore, the data bits stored in the floating gate electrode 140 may be erased.

The erasing state of the data bits may be read by determining whether or not the nonvolatile memory device 100 is turned on. During the reading operation, since no electrons exist in the floating gate electrode 140, the semiconductor channel layer 130 would be turned on. Therefore, a current may flow in the nonvolatile memory device 100.

In the nonvolatile memory device 100, the data bits may be more rapidly erased into the substrate electrode 110, not into the semiconductor channel layer 130, therefore, the operating performance of the nonvolatile memory device 100 may improve. Moreover, the tunneling path of electrons during a programming operation may be different from the tunneling path of electrons during an erasing operation, and thus, the durability of the insulating layer 120 may be improved. In addition, it is not necessary to additionally provide a high voltage circuit in the nonvolatile memory device 100, and thus, the nonvolatile memory device 100 may be economically advantageous.

Figure 5:
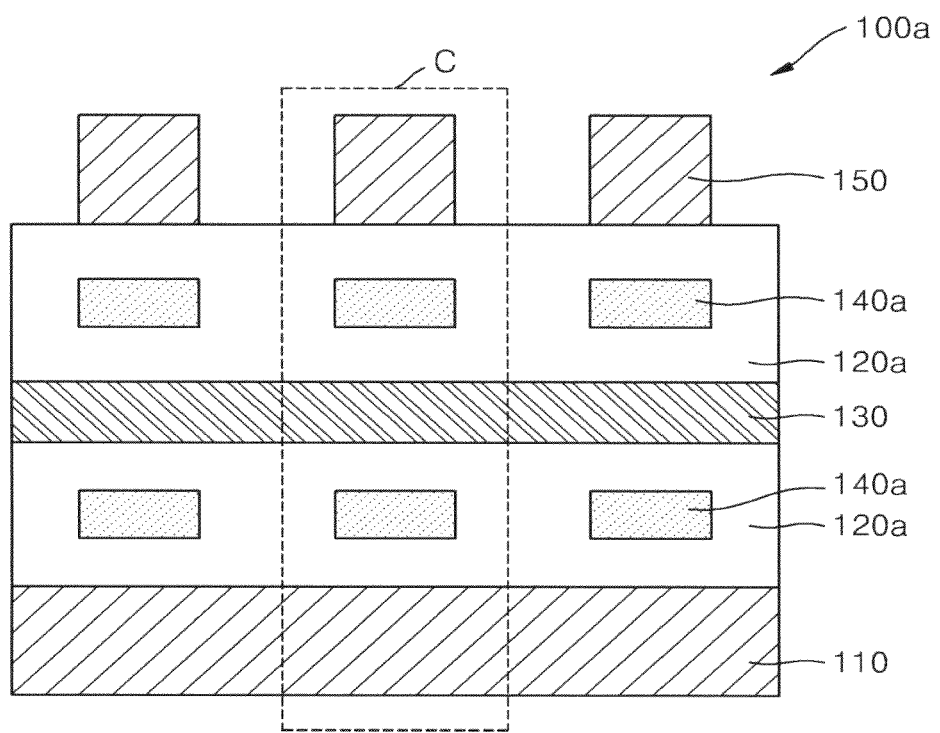
Figure 6:
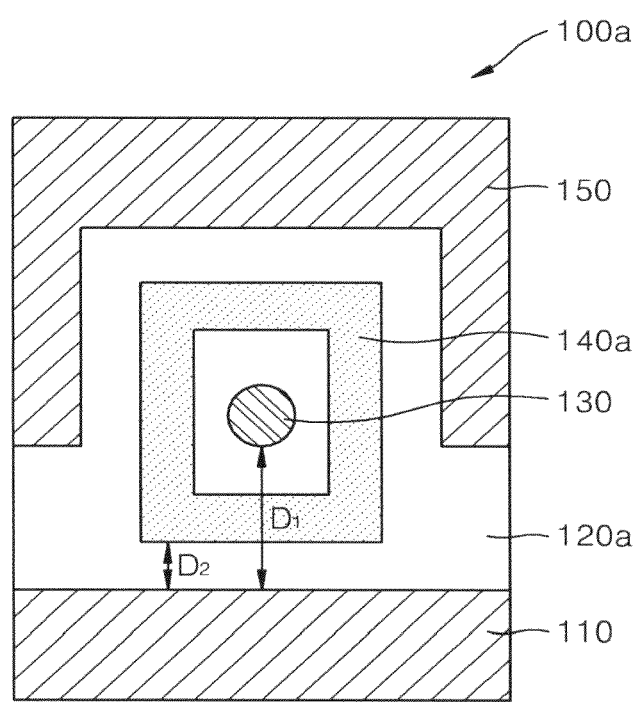

FIGS. 5 and 6 are sectional views illustrating a nonvolatile memory device 100a according to example embodiments. The nonvolatile memory device 100a may be obtained by partially modifying the structure of the nonvolatile memory device 100 of FIGS. 1 and 2. Thus, an explanation with regard to example embodiments illustrated in FIGS. 1 and 2 will be omitted.

Referring to FIGS. 5 and 6, a floating gate electrode 140a may completely surround a semiconductor channel layer 130. For example, the floating gate electrode 140a may have a four-cornered doughnut shape. However, the shape of the floating gate electrode 140a may be changed in various ways. For example, the floating gate electrode 140a may be a hollow-centered structure with a circular, oval, or polygonal profile. An insulating layer 120a may be positioned between two adjacent layers, for example, the substrate electrode 110 and the semiconductor channel layer 130, and/or the floating gate electrode 140a and a control gate electrode 150.

The operation of the nonvolatile memory device 100a may be the same as described with reference to FIGS. 3 and 4. During an erasing operation of the nonvolatile memory device 100a, charge tunneling may occur between a bottom surface of the floating gate electrode 140a and the substrate electrode 110. Therefore, an area of a portion of the floating gate electrode 140a in which charge tunneling occurs may be larger than that of the floating gate electrode 140, illustrated in FIGS. 1 and 2, and the erasing speed of the nonvolatile memory device 100a may then be faster than that of the nonvolatile memory device 100 of FIGS. 1 and 2.

Figure 7:
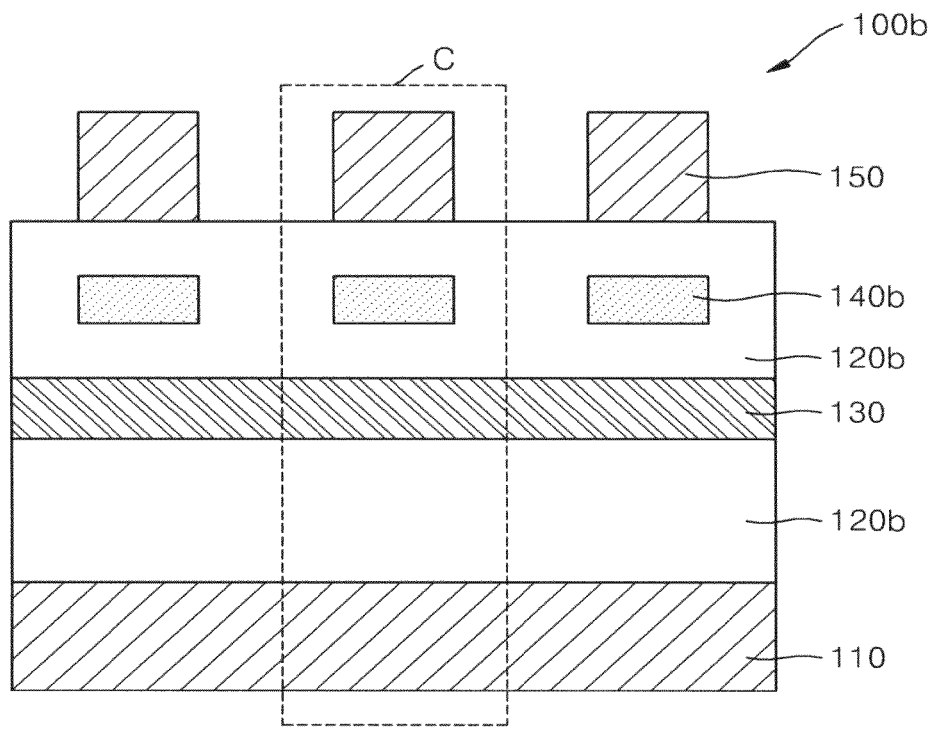
Figure 8:
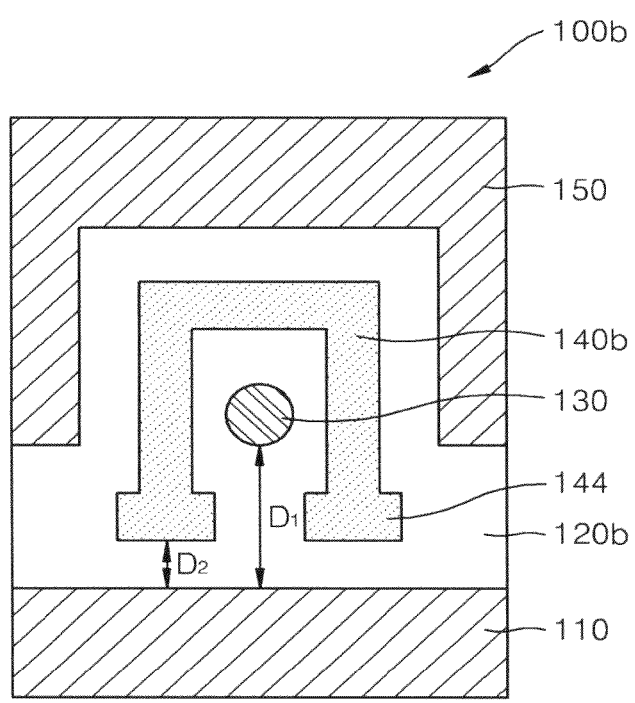

FIGS. 7 and 8 are sectional views illustrating a nonvolatile memory device 100b according to example embodiments. The nonvolatile memory device 100b may be obtained by partially modifying the structure of the nonvolatile memory device 100 of FIGS. 1 and 2. Thus, an explanation with regard to example embodiments illustrated in FIGS. 1 and 2 will be omitted.

Referring to FIGS. 7 and 8, ends of a floating gate electrode 140b facing a substrate electrode 110 may include a tap 144 having for example, a t-shape. The length and shape of the tap 144 is not limited to those illustrated in FIG. 8, and may vary. An insulating layer 120b may be between, for example, the substrate electrode 110 and the semiconductor channel layer 130, and/or the floating gate electrode 140b and the control gate electrode 150.

The operation of the nonvolatile memory device 100b may be similar to that of FIGS. 3 and 4. During an erasing operation of the nonvolatile memory device 100b, charge tunneling may occur between the tap 144 and the substrate electrode 110 and a portion of the floating gate electrode 140b in which charge tunneling occurs may be larger than that of the floating gate electrode 140 of FIGS. 1 and 2. Therefore, the erasing speed of the nonvolatile memory device 100b may be faster than that of the nonvolatile memory device 100 of FIGS. 1 and 2.

Figure 9:
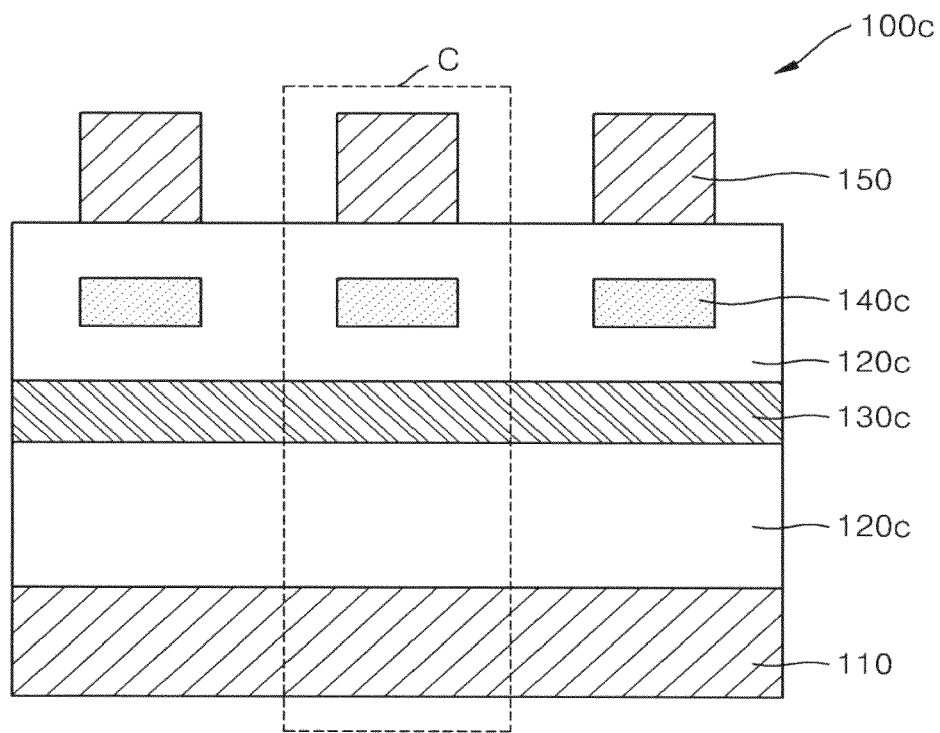
Figure 10:
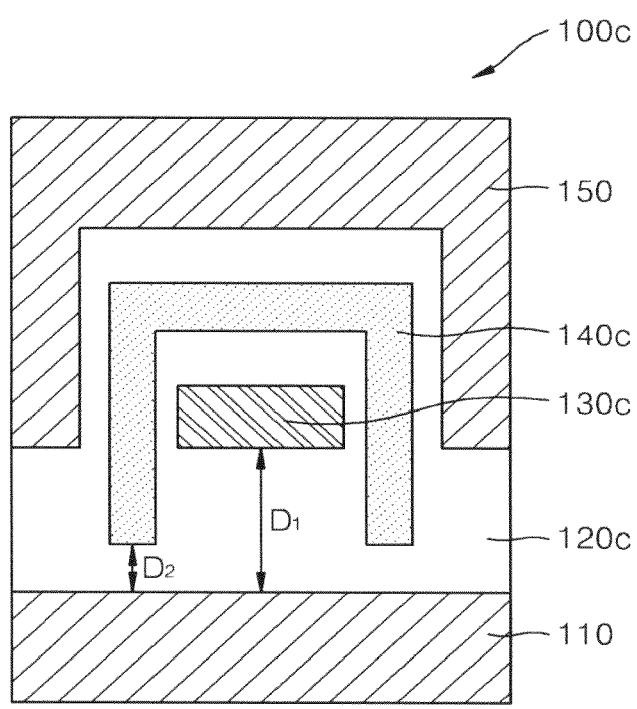

FIGS. 9 and 10 are sectional views illustrating a nonvolatile memory device 100c according to example embodiments. The nonvolatile memory device 100c may be obtained by partially modifying the structure of the nonvolatile memory device 100 of FIGS. 1 and 2. Thus, an explanation with regard to example embodiments illustrated in FIGS. 1 and 2 will be omitted.

Referring to FIGS. 9 and 10, a semiconductor channel layer 130c may include a semiconductor thin film which is positioned on a substrate electrode 110. For example, the semiconductor thin film may include Si, SiGe, GaAs, or ZnO. A floating gate electrode 140c may be on the substrate electrode 110 and partially surround the semiconductor channel layer 130c. The floating gate electrode 140c may be as described above with reference to FIGS. 1 and 2. An insulating layer 120c may be between two adjacent layers, for example, the substrate electrode 110 and the semiconductor channel layer 130c, and/or the floating gate electrode 140c and a control gate electrode 150. The operation of the nonvolatile memory device 100c may be similar to FIGS. 3 and 4.

Figure 11:
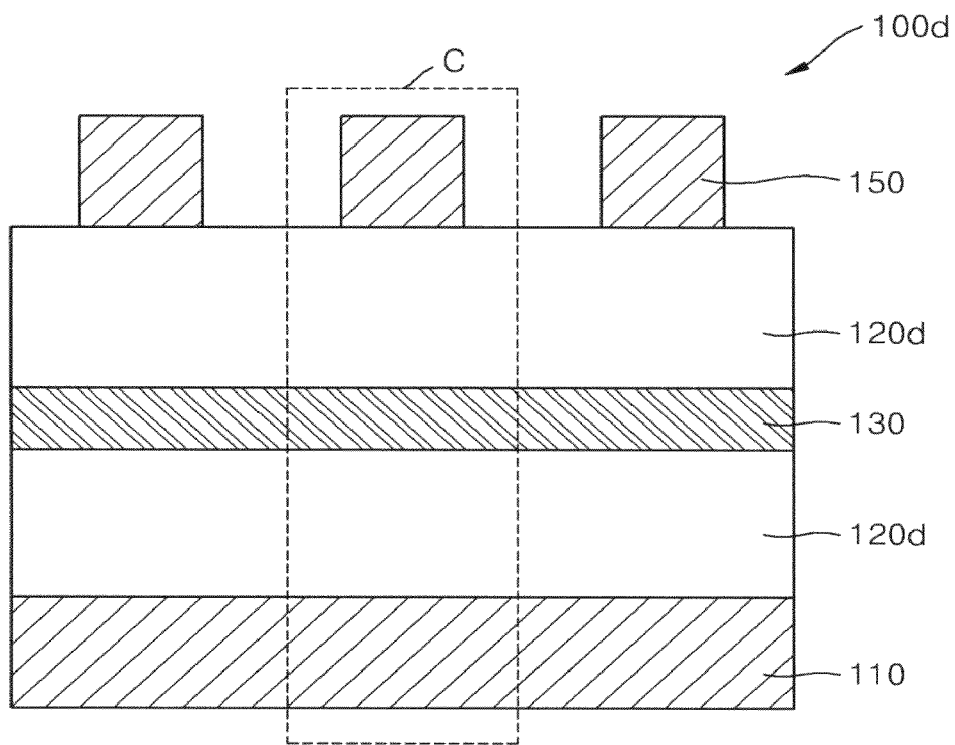
Figure 12:
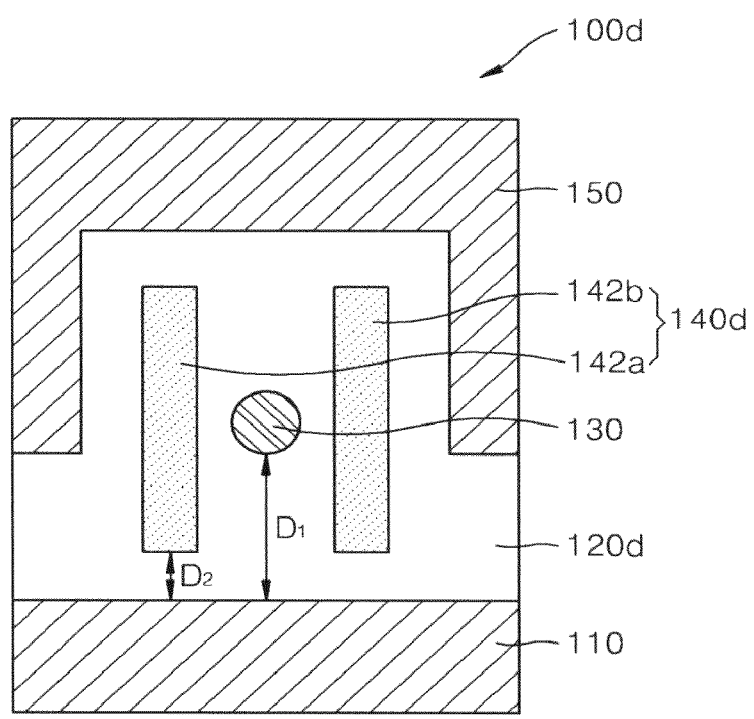

FIGS. 11 and 12 are sectional views illustrating a nonvolatile memory device 100d according to example embodiments. The nonvolatile memory device 100d may be obtained by partially modifying the structure of the nonvolatile memory device 100 of FIGS. 1 and 2. Thus, an explanation with regard to example embodiments illustrated in FIGS. 1 and 2 will be omitted.

Referring to FIGS. 11 and 12, a floating gate electrode 140d may include a first column 142a and a second column 142b which may be opposite to each other with respect to a semiconductor channel layer 130. The first column 142a and the second column 142b may be parallel to each other and positioned on a substrate electrode 110. For example, the floating gate electrode 140d may include at least one column 142a and/or 142b that may have at least a first side facing towards a side of the semiconductor channel layer 130 and at least a second side facing towards the substrate electrode 110. An insulating layer 120d may be between two adjacent layers, e.g., the substrate electrode 110 and the semiconductor channel layer 130, and/or the floating gate electrode 140d and the control gate electrode 150.

The operation of the nonvolatile memory device 100d may be similar to FIGS. 3 and 4. During a programming operation, charges may be tunneled from the semiconductor channel layer 130 into the first column 142a and/or the second column 142b. During an erasing operation, charges may be tunneled from the end of the first column 142a and/or the end of the second column 142b, into the substrate electrode 110. In additional example embodiments, one of the first column 142a and the second column 142b may be omitted. Furthermore, the first column 142a and the second column 142b may be diagonally positioned on the substrate electrode 110.

Figure 13:
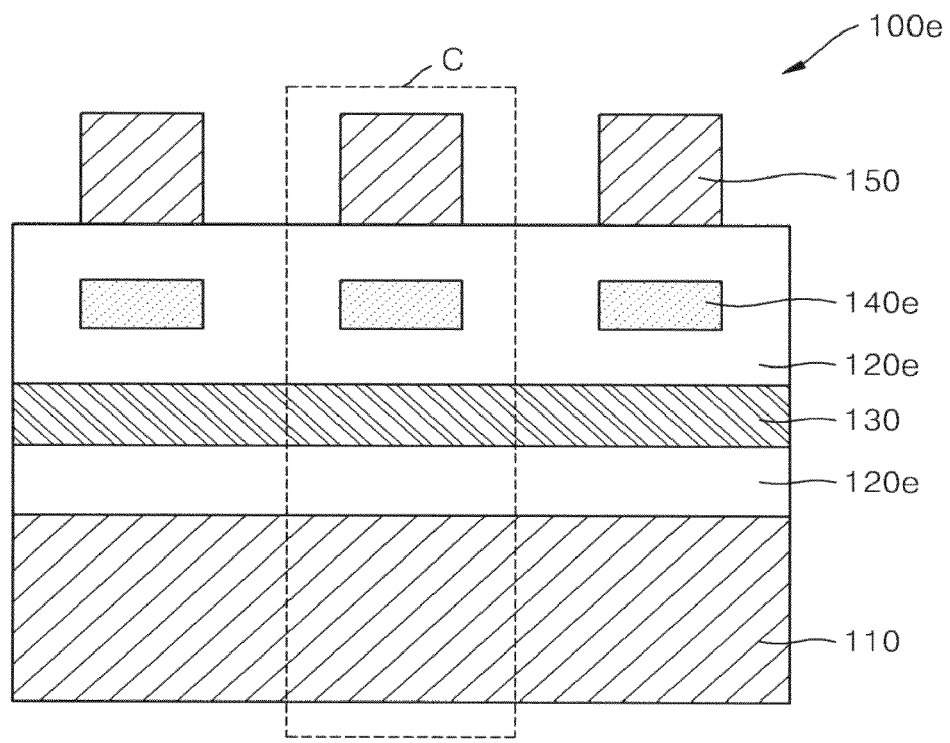
Figure 14:
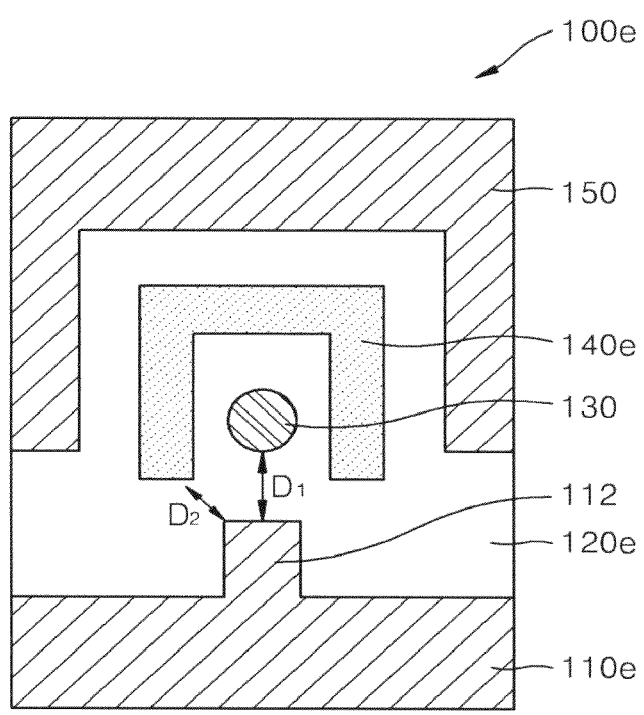

FIGS. 13 and 14 are sectional views illustrating a nonvolatile memory device 100e according to example embodiments. The nonvolatile memory device 100e may be obtained by partially modifying the structure of the nonvolatile memory device 100 of FIGS. 1 and 2. Thus, an explanation with regard to example embodiments illustrated in FIGS. 1 and 2 will be omitted.

Referring to FIGS. 13 and 14, a substrate electrode 110e may be formed by etching a semiconductor wafer. The substrate electrode 110e may include a protrusion 112 extending in the direction of a floating gate electrode 140e. For example, the semiconductor wafer may include Si, Ge, SiGe, GaAs, or ZnO. The floating gate electrode 140e may partially surround a semiconductor channel layer 130 and extends in the direction of the semiconductor channel layer 130. An insulating layer 120e may be between two adjacent layers, e.g., the substrate electrode 110e and the semiconductor channel layer 130, and/or the floating gate electrode 140e and a control gate electrode 150.

A space D2 between the floating gate electrode 140e and the protrusion 112 may be smaller than a space D1 between the semiconductor channel layer 130 and the protrusion 112. The operation of the nonvolatile memory device 100e is similar to FIGS. 3 and 4.

Figure 15:
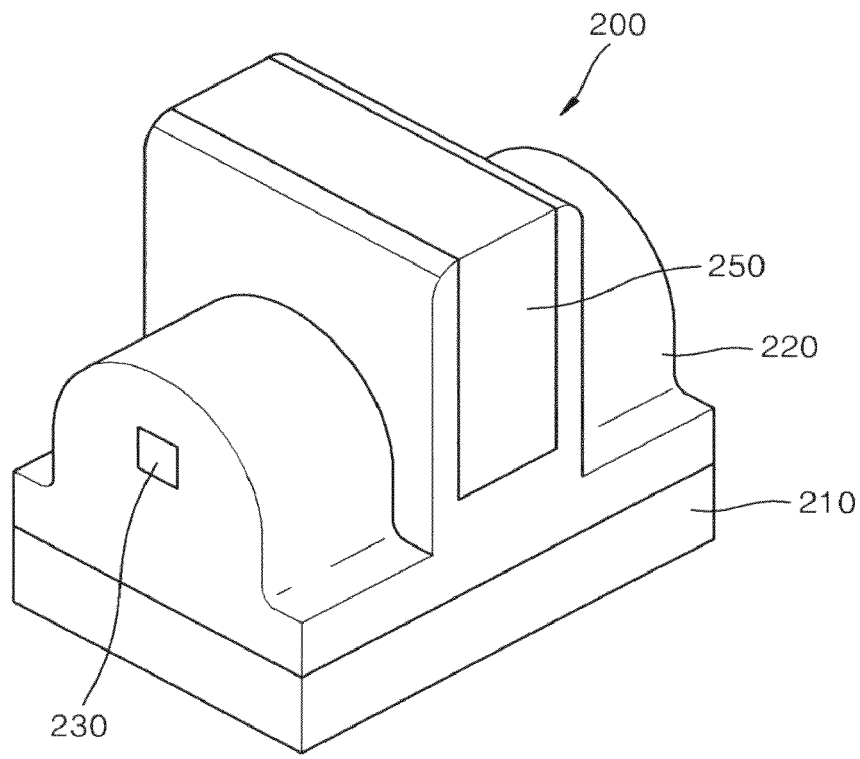
Figure 16:
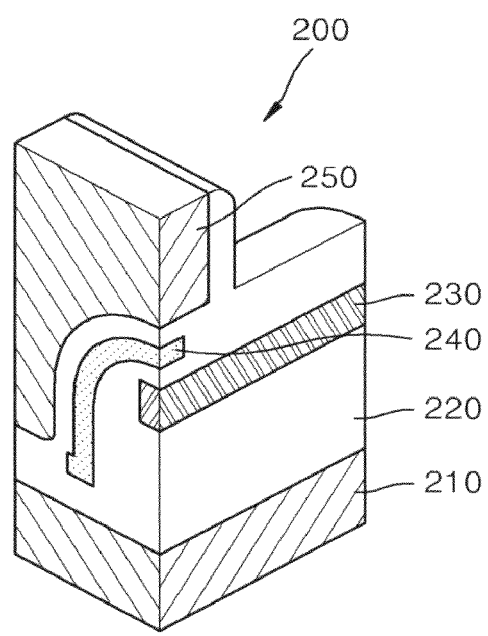

FIG. 15 is a perspective view illustrating a nonvolatile memory device 200 according to example embodiments. FIG. 16 is a partially cut-away perspective view of the nonvolatile memory device 200 of FIG. 15.

Referring to FIGS. 15 and 16, a semiconductor channel layer 230 may have a nanowire structure on a substrate electrode 210. A floating gate electrode 240 may partially surround the semiconductor channel layer 230 and may extend beyond the semiconductor channel layer 230 in the direction of the substrate electrode 210. A control gate electrode 250 may be on the floating gate electrode 240. An insulating layer 220 may be between two adjacent layers, e.g., the substrate electrode 210 and the semiconductor channel layer 230, and/or the floating gate electrode 240 and the control gate electrode 250.

The semiconductor channel layer 230 may extend in a bit line direction, and the control gate electrode 250 may extend in a word line direction. In example embodiments, the floating gate electrode 240 may be formed of N type-doped polysilicon, and a distance between the floating gate electrode 240 and the substrate electrode 210 may be 10 nm.

Figure 17:
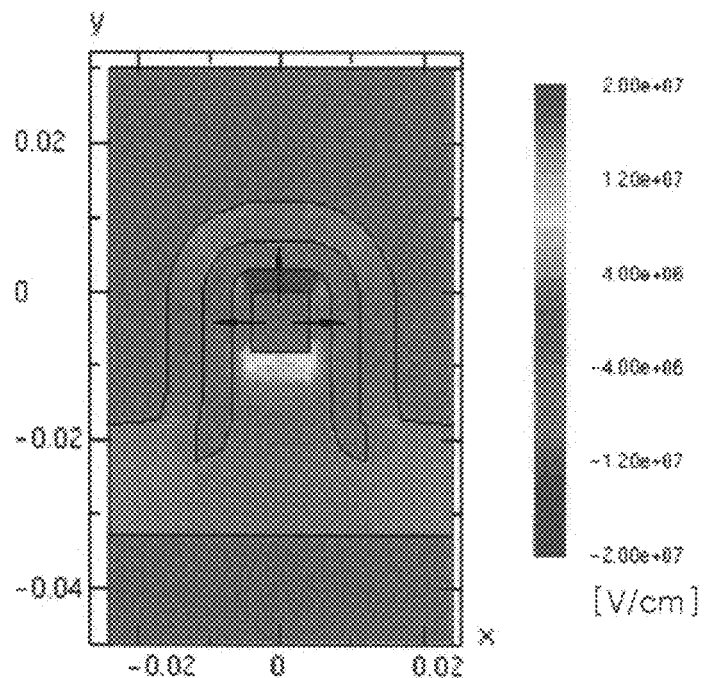

FIG. 17 shows an example simulation illustrating a programming operation of the nonvolatile memory device 200 of FIGS. 15 and 16. Referring to FIGS. 15 through 17, 0 V was applied to the substrate electrode 210, and 12 V was applied to the control gate electrode 250 during the simulation. Thus, an electric field of about 1.7E7 V/cm was induced between the floating gate electrode 240 and the semiconductor channel layer 230. Under the electric field, electrons of the semiconductor channel layer 230 could be tunneled into the floating gate electrode 240. For example, it is known that electron tunneling can occur under an electric field of about 7E6 V/cm or more.

Figure 18:
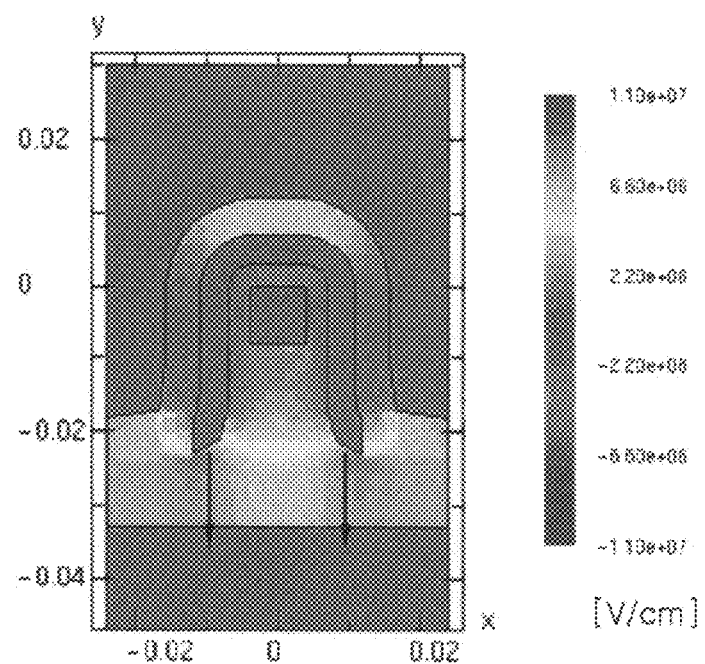

FIG. 18 is an example simulation view illustrating an erasing operation of the nonvolatile memory device 200 of FIGS. 15 and 16. Referring to FIGS. 15, 16, and 18, 10 V was applied to the substrate electrode 210, and 0 V was applied to the control gate electrode 250. In example embodiments, an electric field of about 1.1E7 V/cm was induced between the substrate electrode 210 and an end of the floating gate electrode 240. Under the electric field, electrons of the floating gate electrode 240 could be tunneled into the substrate electrode 210.

Figure 19:
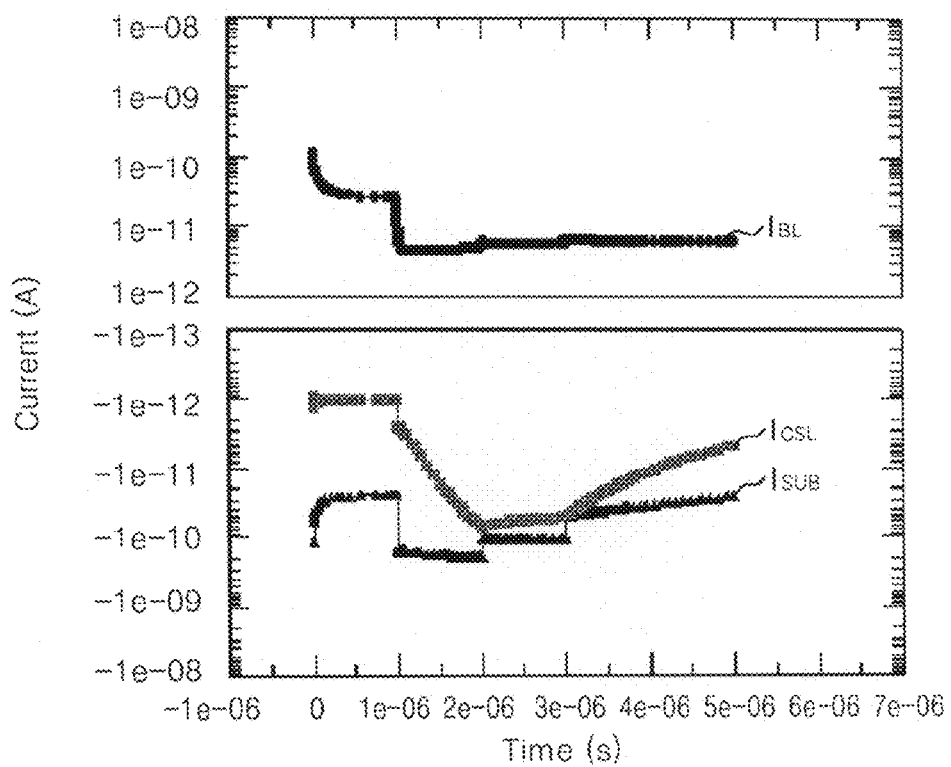
Figure 20:
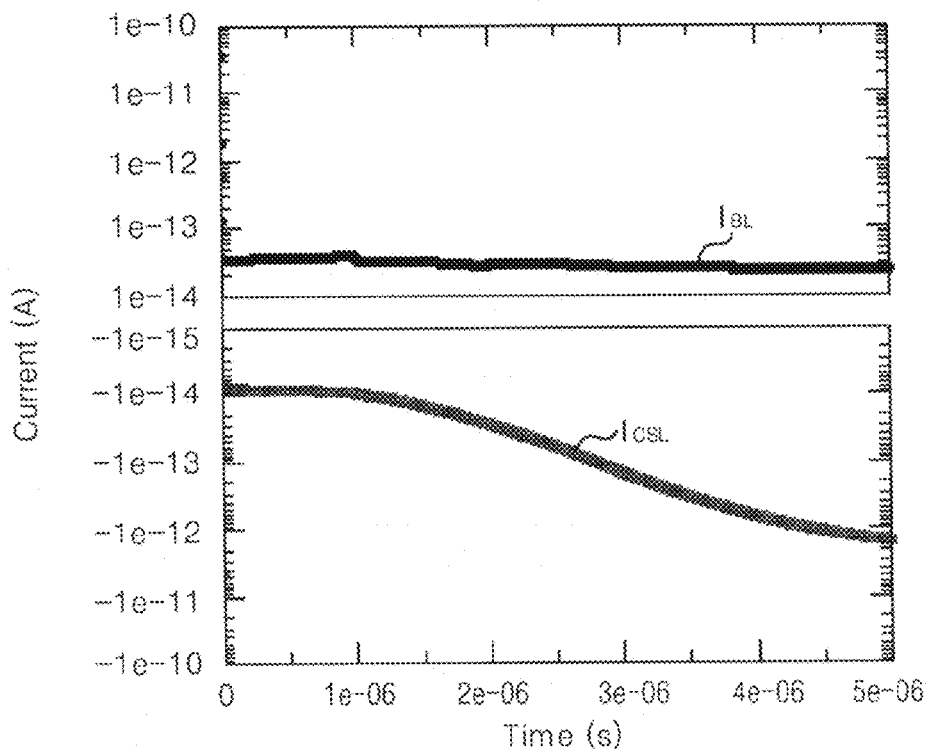

FIG. 19 is a graph illustrating the leakage current characteristics of a nonvolatile memory device according to a conventional example, and FIG. 20 is a graph illustrating the leakage current characteristics of a nonvolatile memory device according to example embodiments. The conventional example is a planar-type nonvolatile memory device, and the example embodiments may be a three-dimensional nonvolatile memory device as illustrated in FIGS. 15 and 16. FIGS. 19 and 20 illustrate the leakage current characteristics with respect to time when an operating voltage is applied to bit lines, and a pass voltage and a programming voltage are applied to control gate electrodes.

Referring to FIG. 19, in the nonvolatile memory device of the comparative example, a current $I_{BL}$ flowing in bit lines was about 10 pA, and a leakage current $I_{SUB}$ flowing into a substrate or a leakage current $I_{CSL}$ flowing into a common source line was about 10 to 100 pA. The leakage currents $I_{SUB}$ and $I_{CSL}$ may reduce a channel boosting voltage at semiconductor channels in order to inhibit the programming operation of the nonvolatile memory device. At a channel boosting voltage of about 18 V, a voltage of only about 5 to 6 V was applied at a semiconductor channel layer. Therefore, a channel boosting efficiency was significantly reduced.

Referring to FIG. 20, in the nonvolatile memory device with no PN junction according to example embodiments, a current $I_{BL}$ flowing in bit lines was about 0.1 to 0.01 pA, and a leakage current $I_{CSL}$ flowing into a common source line was 1 pA or less. That is, the leakage current ($I_{CSL}$) of the nonvolatile memory device of example embodiments was reduced to about 1/100 or less of that of the comparative example. Thus, at a channel boosting voltage of about 10V, a high voltage of about 7-8 V was applied to a semiconductor channel layer. This illustrates that the channel boosting efficiency of example embodiments is higher than that of the nonvolatile memory device of the comparative example. Since the nonvolatile memory device of example embodiments has a higher channel boosting efficiency than the nonvolatile memory device of the comparative example, the critical dimension of a control gate electrode may be reduced.

While example embodiments have been particularly shown and described with reference to example embodiments and FIGS. 1-18 and 20, it will be understood by one of ordinary skill in the art that various changes in form and details may be made therein without departing from the spirit and scope of example embodiments as defined by the following claims. For example, the shape of a floating gate electrode may be variously modified within the spirit of example embodiments.

In the nonvolatile memory devices according to example embodiments, data bits may be more rapidly erased into a substrate electrode, not into a semiconductor channel layer. Therefore, the operating performance of a nonvolatile memory device may be improved. Further, since an electron tunneling path during a programming operation may be different from that during an erasing operation, the durability of an insulating layer may also be improved. Still further, as it is not necessary to additionally provide a high voltage circuit to the nonvolatile memory device, the nonvolatile memory device may be economically advantageous.

Further, in nonvolatile memory devices according to example embodiments, the leakage current of a semiconductor memory transistor may be reduced using semiconductor nanowires, thereby increasing the channel boosting efficiency of the semiconductor memory transistor. In addition, the semiconductor nanowires may be more easily stacked, and thus, the nonvolatile memory device may be more easily made in a highly integrated structure.

The foregoing is illustrative of example embodiments and is not to be construed as limiting thereof. Although example embodiments have been described, those skilled in the art will readily appreciate that many modifications are possible in example embodiments without materially departing from the novel teachings and advantages. Accordingly, all such modifications are intended to be included within the scope of this invention as defined in the claims. In the claims, means-plus-function clauses are intended to cover the structures described herein as performing the recited function, and not only structural equivalents but also equivalent structures. Therefore, it is to be understood that the foregoing is illustrative of various example embodiments and is not to be construed as limited to example embodiments disclosed, and that modifications to example embodiments, as well as other example embodiments, are intended to be included within the scope of the appended claims.

What is claimed is:

1. A nonvolatile memory device comprising:
a substrate electrode;
a semiconductor channel layer on the substrate electrode;
a floating gate electrode on the substrate electrode, a portion of the floating gate electrode facing towards the semiconductor channel layer, the semiconductor channel layer between at least part of the floating gate electrode and the substrate electrode; and
a control gate electrode on the floating gate electrode,
wherein a space between a portion of the floating gate electrode and the substrate electrode is smaller than a space between the semiconductor channel layer and the substrate electrode, and
the space between the portion of the floating gate electrode and the substrate electrode is about 5 to 50 nm.

2. The nonvolatile memory device of claim 1, wherein the nonvolatile memory device is configured to tunnel charge between a portion of the floating gate electrode and the substrate electrode.

3. The nonvolatile memory device of claim 1, wherein the semiconductor channel layer includes semiconductor nanowires.

4. The nonvolatile memory device of claim 3, wherein the semiconductor nanowires are doped with P- or N-type impurities and have no PN junction.

5. The nonvolatile memory device of claim 1, wherein the semiconductor channel layer includes a semiconductor thin film.

6. The nonvolatile memory device of claim 1, wherein the floating gate electrode partially surrounds the semiconductor channel layer, and an end of the floating gate electrode extends beyond the semiconductor channel layer and faces towards the substrate electrode.

7. The nonvolatile memory device of claim 6, wherein the end of the floating gate electrode forms a tap and faces towards the substrate electrode.

8. The nonvolatile memory device of claim 1, wherein the floating gate electrode includes at least one column having at least a first side facing towards a side of the semiconductor channel layer and at least a second side facing towards the substrate electrode.

9. The nonvolatile memory device of claim 1, wherein the control gate electrode partially surrounds a portion of the floating gate electrode and extends towards the substrate electrode.

10. The nonvolatile memory device of claim 1, further including an insulating layer between two adjacent layers, including the substrate electrode and the semiconductor channel layer, and/or the floating gate electrode and the control gate electrode.

11. The nonvolatile memory device of claim 1, wherein the floating gate electrode is conductive.

12. The nonvolatile memory device of claim 1, wherein the substrate electrode is conductive.

13. The nonvolatile memory device of claim 12, wherein the substrate electrode includes a semiconductor wafer.

14. The nonvolatile memory device of claim 13, wherein the semiconductor wafer includes at least one protrusion extending towards the floating gate electrode.

15. A nonvolatile memory device, comprising:
a substrate electrode;
a semiconductor channel layer on the substrate electrode;
a floating gate electrode on the substrate electrode, a portion of the floating gate electrode facing towards the semiconductor channel layer, the semiconductor channel layer between at least part of the floating gate electrode and the substrate electrode; and
a control gate electrode on the floating gate electrode,
wherein a space between a portion of the floating gate electrode and the substrate electrode is smaller than a space between the semiconductor channel layer and the substrate electrode, and
the space between the portion of the floating gate electrode and the substrate electrode is 10 to 30 nm.

16. A nonvolatile memory device, comprising:
a substrate electrode;
a semiconductor channel layer on the substrate electrode;
a floating gate electrode on the substrate electrode, a portion of the floating gate electrode facing towards the semiconductor channel layer, the semiconductor channel layer between at least part of the floating gate electrode and the substrate electrode; and
a control gate electrode on the floating gate electrode,
wherein a space between a portion of the floating gate electrode and the substrate electrode is smaller than a space between the semiconductor channel layer and the substrate electrode, and
the floating gate electrode completely surrounds the semiconductor channel layer.

17. A method of operating a nonvolatile memory device, the method comprising:

programming the nonvolatile memory device by injecting charges from a semiconductor channel layer into a floating gate electrode; and erasing the nonvolatile memory device by removing charges from the floating gate electrode into a substrate electrode, wherein the nonvolatile memory device includes
  the substrate electrode,
  the semiconductor channel layer on the substrate electrode,
  the floating gate electrode on the substrate electrode, a portion of the floating hate electrode facing towards the semiconductor channel layer, the semiconductor channel layer between at least part of the floating gate electrode and the substrate electrode, and
  a control gate electrode on the floating gate electrode, and a space between a portion of the floating gate electrode and the substrate electrode is smaller than a space between the semiconductor channel layer and the substrate electrode.

18. The method of claim 17, the programming including,
applying a substrate voltage to the substrate electrode; and
applying a programming voltage to the control gate electrode,
wherein the programming voltage is higher than the substrate voltage.

19. The method of claim 18, wherein the substrate voltage is 0 to 5V, and
the programming voltage is 7 to 20V.

20. The method of claim 17, the erasing including,
applying an erasing voltage to the substrate electrode; and
grounding the control gate electrode.

21. The method of claim 20, wherein the erasing voltage is 7 to 20V.

22. The method of claim 17, the erasing further including, grounding the semiconductor channel layer.

* * * * *